United States Patent [19]

Mikesell

[11] 3,903,326

[45] Sept. 2, 1975

[54] PROCESS FOR PRODUCING METAL CLAD CIRCUIT BOARDS

[75] Inventor: Sharell L. Mikesell, Coshocton, Ohio

[73] Assignee: General Electric Company, Schenectady, N.Y.

[22] Filed: Dec. 13, 1973

[21] Appl. No.: 424,516

[52] U.S. Cl. .................... 427/98; 427/302; 427/304

[51] Int. Cl.$^2$ ............................................ B44D 1/18

[58] Field of Search.......... 117/212, 227, 213, 47 R; 204/15

[56] References Cited

UNITED STATES PATENTS

| | | | |
|---|---|---|---|
| 3,620,933 | 12/1969 | Grunwald et al. | 117/212 |
| R28,042 | 6/1974 | Rhodenizer et al. | 117/212 |

*Primary Examiner*—John D. Welsh

[57] ABSTRACT

In the preparation of circuit board substrates for the reception of metal cladding wherein a transient anodized aluminum foil is used to sensitize the substrate surface for metal reception, it has been found that a thin layer of resin on the anodized aluminum surface results in improved peel strength and molten solder resistance of the metal clad substrate.

5 Claims, No Drawings

PROCESS FOR PRODUCING METAL CLAD CIRCUIT BOARDS

This invention relates to resin impregnated circuit board substrates. More particularly, it relates to such circuit board substrates in which the applied metal cladding is characterized by improved peel strength and resistance to molten solder.

Circuit board substrates comprising a resin impregnated base such as paper, glass fabric and the like are well known, such structures being typified by phenolic impregnated paper sheets which are laid up into a laminate of the desired thickness. It is also well known to deposit a strike or flash of metal on the substrates as by electroless plating, such strike then being followed by a thicker layer of electroplated or electroless plated metal which latter can be formed into the desired circuitry by selectively etching away unwanted portions of the metal. Metal can also be deposited in the desired circuit configuration by masking out that part of the substrate surface which does not define the circuitry configuration required.

While phenolic resins are most generally used for impregnating paper base substrates, other resins such as epoxies, polyesters, melamines, alkyds and the like can be used depending upon the desired end use of the circuit board.

A persistent deficiency of circuit boards is the undesirably low peel strength of the copper or other deposited metal which forms the circuit and the failure of such metal cladding particularly when the board is dipped into molten solder in the process of interconnecting the various circuits formed on the board. There has been an equally persistent effort to overcome this deficiency of peel strength and metal failure. In one process described in U.S. Pat. No. 3,620,933, included by reference herein, a thin aluminum foil which has been anodized as by treatment with phosphoric or other acid is applied to the resin impregnated substrate, the anodized surface being pressed into the resin. The foil is subsequently, in the preparation of the circuit board, dissolved as by the use of a base or acid, leaving a microporous resin surface which is particularly receptive to later metal deposition. However, even in cases such as that described, the peel strength of the applied metal and resistance to heat shock as by dipping in solder leaves something to be desired.

It is a primary object of the present invention to provide circuit board substrates of such surface treatment that when metal is later deposited thereon by electroless or electroplating processes, the peel strength and heat shock resistance are much improved.

Those features of the invention which are believed to be novel are set forth with particularity in the claims appended hereto. The invention will, however, be better understood and further advantages and objects thereof appreciated from a consideration of the following description.

Briefly, according to the present invention, the surface of the anodized aluminum foil is treated with a resin or adhesive layer, such resin layer being applied to the anodized surface of the foil which contacts the substrate surface. It has been unexpectedly found that circuit board substrates so prepared are, when the anodized aluminum foil has been removed as by dissolution, particularly receptive to metal cladding. Furthermore, it has been found that such metal cladding is characterized by an unexpected increase in peel strength and resistance to solder shock or failure when dipped into or treated with molten solder at temperatures of the order of 500°F and above. Any of a number of resinous materials or adhesives have been found to be useful in connection with the present invention. Particularly useful are adhesives made from phenolic-polyvinyl butyral typified by Palmer 1161 adhesive.

It has been found that the desirable improvements of the present invention are particularly achieved when the adhesive or resinous layer on the anodized aluminum foil is from about 1.0 to 1.5 mils thick and the cure of the resin such as that when tested by solvent extraction of the coated foil using acetone or other suitable solvents such as methyl ethylketone, methyl cellosolve and the like, the weight loss is about 20 to 30 percent by weight. The preferred method is to immerse a pre-weighed sample of the resin coated anodized aluminum foil in acetone at 24°C for 5 minutes. The sample is then dried and reweighed to determine the loss in weight. This weight loss measurement is the preferred test method for measuring the degree of cure of the adhesive layer during the coating operation.

In preparing the circuit board substrates of the present invention, the paper laminae of the usual type are impregnated with a phenolic resin and built up to the desired thickness, in the following examples for such phenolic resin impregnated sheets being used. The anodized foil is one which has been treated with phosphoric acid and is manufactured by the MacDermid Corporation. The resin or adhesive layer can be applied to the anodized aluminum foil in any desired manner such as by kiss or knife coating, spraying, painting, brushing and the like, the only limitation being that it should have a thickness of about 1.0 to 1.5 mils. The thus coated anodized aluminum foil is heated at a temperature of from about 80° to 150°C to advance the cure of the adhesive to meet the above criteria as measured by solvent resistance for typically about 3 to 5 minutes. Departures from the stated thickness and degree of cure, while still affording a material which contributes to the peel strength and molten solder resistance of the final metal clad circuit board, do not achieve these characteristics to the fullest extent possible.

The resin coated anodized aluminum foil is placed on the resin impregnated substrate in resin to resin relationship and pressed at a temperature of 100°C to 150°C at a pressure of from about 800 psi to 1200 psi, and preferably 140°C and 1000 psi. Next, following the teaching of the above U.S. Pat. No. 3,620,933, the aluminum foil is removed by treating with 30 percent by weight hydrochloric acid. Then the surface is catalyzed and electrolessly plated with a strike of copper about 0.0001 inch thick, this strike layer being overlaid with plated copper layers of various thicknesses.

The following examples illustrate and point out the advantages of the present invention as compared to a typical prior art process, it being realized that they are to be taken as exemplary only and not limiting in any way.

Various substrates were prepared using a phenolic impregnated paper laminate about one-sixteenth inch thick, the phenolic treated substrate in each case being overlaid with anodized aluminum foil without the present resin treatment, the aluminum foil subsequently being removed and clad with copper to the thicknesses

TABLE III

| Ex. | Adhesive Thickness on Al Foil (mils) | Adhesive Cure Time At 80°C (min.) | At 160°C (min.) | Copper Peel Strength (lb./in.) | Peel Strength After Solder Float 10 sec. at 500°F (lb./in.) | Solder Float (sec.) | Copper Thickness (mils) |
|---|---|---|---|---|---|---|---|
| 14 | 1.0–1.5 | 18 | 2 | 2–4 | — | 23 | 1.4 |
| 15 | 1.0–1.5 | 18 | 2 | 2–4 | — | 27 | 1.4 |
| 16 | 1.0–1.5 | 18 | 2 | 2–3 | 2–4 | 21 | 1.4 |
| 17 | 1.0–1.5 | 18 | 0 | 8–10 | 7–8 | 11 | 1.4 |
| 18 | 1.0–1.5 | 18 | 1 | 8–9 | 10–11 | 30 | 1.4 |
| 19 | 1.0–1.5 | 8 | 1 | 9–12 | 10–13 | 25 | 1.4 |
| 20 | 1.0–1.5 | 8 | 1 | 9–15 | 10–16 | 20 | 1.4 |
| 21 | 1.0–1.5 | 10 | 1 | 10–12 | 10–12 | 20 | 1.4 |

shown in Table I below, and heat treated all as taught in the above patent.

TABLE I

| Ex. | Copper Peel Strength (lb./in.) | Solder Float at 500°F (sec.) | Copper Thickness (mils) |
|---|---|---|---|
| 1 | 4.0 | 3 | 2.1 |
| 2 | 4.0 | 5 | 2.0 |
| 3 | 4.0 | 7 | 2.0 |
| 4 | 4.0 | 2 | 1.3 |
| 5 | 3.5 | 7 | 1.0 |
| 6 | 4.0 | 5 | 1.3 |

It will be seen that the peel strength which is that measured immediately after application is unacceptably low as is the 500°F solder float time.

Shown in Table II below are various examples which duplicate those above except that there was applied to the substrate-contacting surface of the anodized aluminum a resin layer from about 0.2 to 0.3 mil thick, such layer after application to the anodized foil having been precured at a temperature of 140°C for about 4 minutes. In the case of Examples 7 through 10, the resin was a phenolic polyvinyl butyral base material, specifically Palmer 1161. In the case of Examples 11 through 13, the resin was a similar base resin or adhesive material. 8n

TABLE II

| Ex. | Copper Peel Strength (lb./in.) | Solder Float at 500°F (sec.) | Copper Thickness (mils) |
|---|---|---|---|
| 7 | 5.6 | 3 | 2.0 |
| 8 | 6.0 | 5 | 1.5 |
| 9 | 6.0 | 7 | 1.3 |
| 10 | 6.0 | 0 | 1.3 |
| 11 | 6.0 | 5 | 1.6 |
| 12 | 6.0 | 7 | 1.6 |
| 13 | 6.0 | 0 | 1.4 |

From Table II above it will be seen that there is generally an increase in copper peel strength of the copper plate of the indicated thickness applied by the above process.

Shown in Table III below, or more specifically by Examples 14 through 21, are the generally most preferred embodiments of the present invention wherein a base resin layer about 1.0 to 1.5 mils thick was applied to the anodized aluminum foil, the resin being precured under the conditions indicated.

From the data in Table III the advantages of the present invention will become apparent. In Examples 14 through 16 the resin layer was over-cured leading to low copper peel strength whereas in the rest of the examples the cure was proper for the present purpose giving good peel strength and solder resistance.

There are provided by the present invention improved circuit board substrates, metal deposited thereon being characterized by improved peel strength and solder resistance along with other favorable characteristics.

What I claim as new and desire to secure by Letters Patent of the United States is:

1. In the preparation of metal clad circuit boards wherein a. anodized aluminum foil prepared by acid treatment is applied with heat and pressure to the circuit board substrate, b. the aluminum foil is solution removed from the substrate, c. the exposed substrate surface is catalyzed and plated with metal, the improvement which comprises precoating the anodized aluminum surface which is to contact the substrate with a resin layer about 1.0 to 1.5 mils thick, the cure of the resin layer as measured by solvent extraction loss being about 20 to 30 percent by weight.

2. The process of claim 1 in which said resin is phenolic-polyvinyl butyral resin.

3. The process of claim 1 in which said solvent is acetone.

4. The process of claim 1 in which said metal is copper.

5. The product produced by the process of claim 1.

* * * * *